United States Patent
Vander Wagt et al.

[11] Patent Number: 5,869,845
[45] Date of Patent: Feb. 9, 1999

[54] RESONANT TUNNELING MEMORY

[75] Inventors: Jan Paul Vander Wagt, Dallas, Tex.;
Hao Tang, Silver Spring, Md.

[73] Assignee: Texas Instruments Incorporated, Dallas, Tex.

[21] Appl. No.: 882,808

[22] Filed: Jun. 26, 1997

[51] Int. Cl.[6] .................................................. H01L 29/06
[52] U.S. Cl. ............................................ 257/25; 365/175
[58] Field of Search .................................. 257/25; 365/175

[56] References Cited

U.S. PATENT DOCUMENTS

4,999,697  3/1991  Capasso et al. ............................ 357/34

*Primary Examiner*—Olik Chaudhuri
*Assistant Examiner*—Douglas A. Wille
*Attorney, Agent, or Firm*—Robby T. Holland; Carl H. Hoel; Richard L. Donaldson

[57] ABSTRACT

A resonant tunneling diode stack used as a memory cell stack (X0-Xn) with sequential read out of bits of data cells (X1-Xn) by increasing ramp rates to transfer the stored bit to a lowest ramp rate cell (X0).

3 Claims, 6 Drawing Sheets

- DUMMY CELL $X_0$ FOR READ OPERATION
- "TRANSMIT" VALUES $X_n$ TO $X_0$ DURING SN RAMP
- DETECT HIGH $X_0$ BY SENSING CURRENT THROUGH pass + read FET
- IF VALLEY CURRENT OF $RTD_0 > I_{bias}$, THEN SELF-RESETTING

RESONANT TUNNELING MEMORY

CROSS-REFERENCE TO RELATED APPLICATIONS

Copending U.S. patent application Ser. No. 08/918,320, filed Aug. 26, 1,997, discloses related subject matter.

BACKGROUND OF THE INVENTION

The invention relates to electronic devices, and, more particularly, to resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Figure 1:
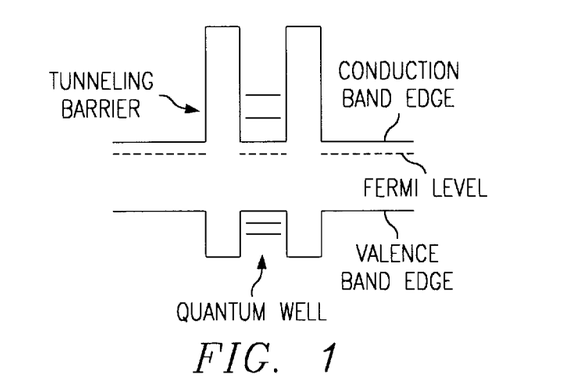
Figure 2:
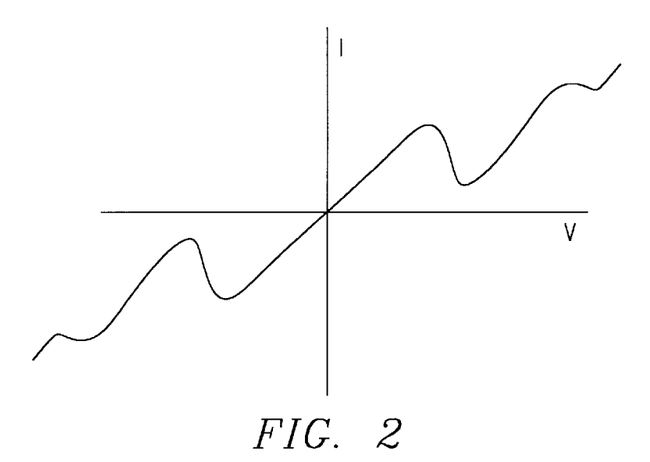
Figure 3A:
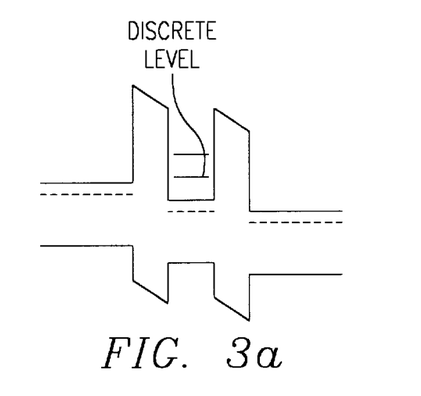
Figure 3B:
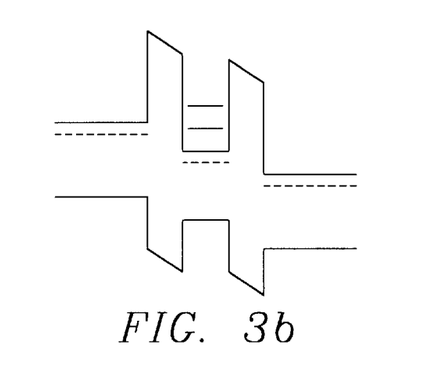

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J.Vac.Sci.Tech.B 965 (1993), and Özbay et al, 110-GHz Monolithic Resonant-Tunneling-Diode Trigger Circuit, 12 IEEE Elec.Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

Attempts to fabricate quantum wells in silicon-based semiconductors, rather than the III-V semiconductors such as AlGaAs and GaAs, have focussed primarily on silicon-germanium alloys for heterojunctions. More recently, use of very thin silicon oxide tunneling barriers has been investigated. Tsu, U.S. Pat. No. 5,216,262, describes a silicon-based quantum well structure with tunneling barriers made of short period silicon/silicon dioxide superlattices of epitaxial silicon dioxide two monolayers thick.

Application of resonant tunneling diodes to memory devices has been limited.

SUMMARY OF THE INVENTION

The present invention provides a read/write memory structure based on a stack of resonant tunneling diode (or other negative resistance devices) memory cells with writing to selective cells and sequential reading out of all cells in a stack.

This memory structure has the advantages of small size, low power, and three dimensional integration.

BRIEF DESCRIPTION OF THE DRAWINGS

The drawings are schematic for clarity.

FIGS. 1–3b are band diagrams of a known resonant tunneling diode together with a current-voltage curve.

DESCRIPTION OF THE PREFERRED EMBODIMENTS

Resonant tunneling diode stack overview

Figure 4:
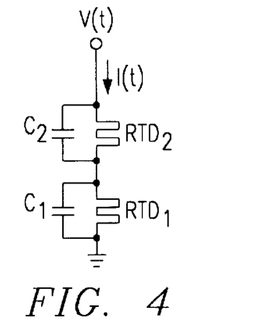
FIG. 4 illustrates a stack of two RTD plus capacitor memory cells.
Figure 5:
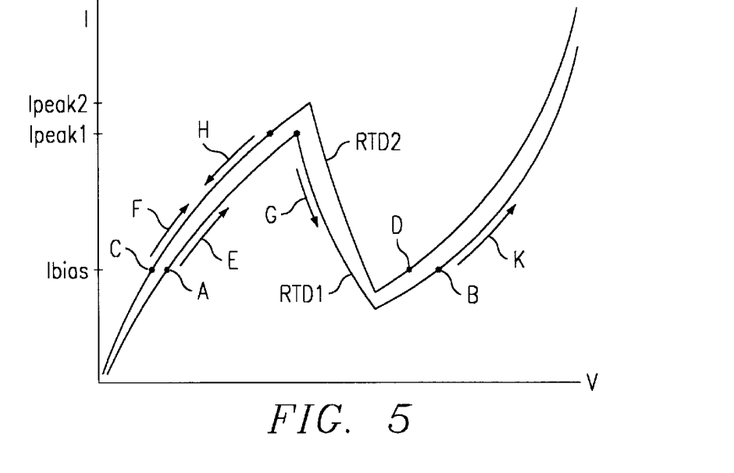
FIG. 5 shows two RTD current-voltage curves.

FIG. 4 schematically shows a stack of two resonant tunneling diode (heuristically represented by two tunneling barriers as in FIG. 1) in series and labelled RTD1 and RTD2. Capacitor C1 connected in parallel with RTD1 forms a first 1-bit memory cell, and capacitor C2 connected in parallel with RTD2 forms a second 1-bit memory cell. Capacitors C1 and C2 represent both the internal (parasitic) capacitances of RTD1 and RTD2 plus any external capacitance across the RTD terminals. These memory cells store bits by switching between a state of low-current at low-voltage and a state of low-current at high-voltage. In particular, FIG. 5 illustrates the current-voltage curves of RTD1 and RTD2 with the peak current Ipeak1 of RTD1 less than the peak current Ipeak2 of RTD2. RTD1 and RTD2 have quite similar current-voltage curves, and the differences could be fabricated simply by making RTD2 with slightly larger area than RTD1 for mesa geometry diodes. Except during read and write operations, a current source applies the (dc) current Ibias through both RTD1 and RTD2. Thus RTD1 can be in the state labelled A in FIG. 5 with a low-voltage drop and current Ibias or in the state labelled B with high-voltage drop and current Ibias. RTD1 in state A could represent a first memory cell bit equal to 0and state B a bit equal to 1. Similarly, RTD2 in state C could represent a second memory cell bit equal to 0 and state D a bit equal to 1.

The memory cells are written to and erased by varying the voltage across the stack of cells. In particular, the current through the first cell splits into the current through an idealized RTD1 and the current through capacitor C1 where idealized RTD1 represents the dc response of FIG. 5 and C1 includes the internal capacitance of RTD1. Similarly, this current splits in the second cell to current through the idealized RTD2 and through capacitor C2. Thus for a varying voltage v(t) across the first memory cell, the current through is the sum of the corresponding i(t) from FIG. 5 for RTD1 and C1 dv(t)/dt.

First consider the case of the two memory cells each storing a 0 bit; that is, RTD1 is in state A and RTD2 is in state C. Then ramp up the voltage V(t) across the stack of memory cells (see FIG. 4) with the ramp rate small enough so that the currents through the capacitors C1 and C2 are negligible compared to the currents through the idealized RTD1 and RTD2. As the voltage ramps up the states of RTD1 and RTD2 follow arrows E and F in FIG. 5, respectively; note that the currents through RTD1 and RTD2 increase but remain equal because the currents through the capacitors C1 and C2 are neglected. Eventually, the currents through RTD1 and RTD2 reach Ipeak1. At this point RTD1 enters its negative resistance region and the voltage drop across RTD1 increases and the current through RTD1 decreases as indicated by arrow G in FIG. 5. Simultaneously, the voltage drop across and the current through RTD2 both decrease as shown by arrow H in FIG. 5. If V(t) were now held roughly constant, then RTD1 would enter state B and RTD2 return to state C, and the current through the cells would again be Ibias. Indeed, a current source supplying Ibias would provide the increase in dc voltage. This ramping of V(t) had the net result of switching RTD1 from sate A to state B and thus writing a 1 into the first memory cell.

Figure 6:
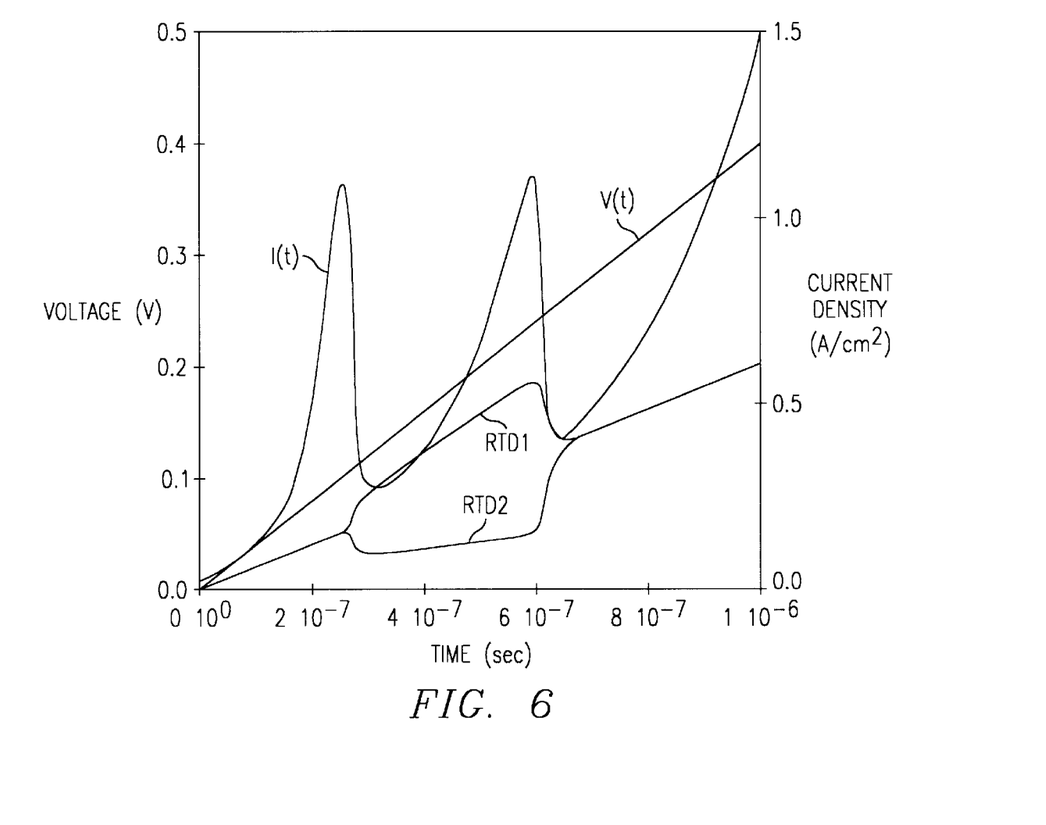
FIG. 6 shows the response of a stock of two cells to a voltage ramp.

If V(t) continued to ramp up after RTD1 switched, then again the current through the memory cells would increase, the state of RTD1 moving as indicated by arrow K in FIG. 5 and the state of RTD2 again moving along arrow F. Eventually, the current will reach Ipeak2, at which time RTD2 will enter its negative resistance region and the voltage across RTD2 will increase and the current will decrease as RTD2 moves to state D; simultaneously RTD1 will have a voltage drop and current decrease and return to state B. FIG. 6 summarizes the situation for a linear ramp of V(t).

Figure 7A:
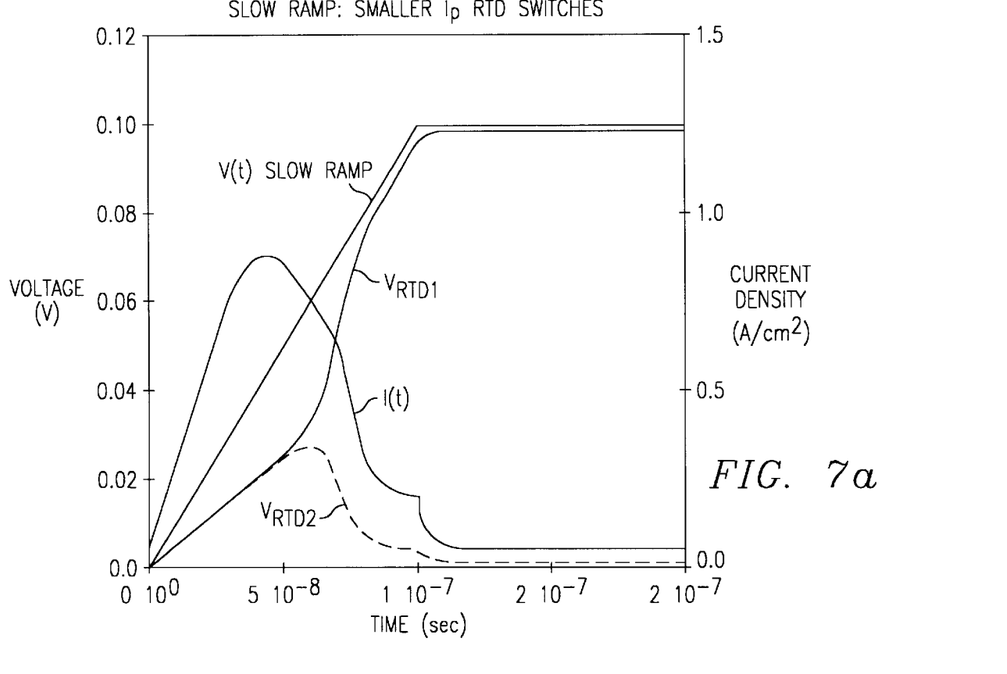
FIGS. 7a–b illustrate selective writing in a stack of two cells.
Figure 7B:
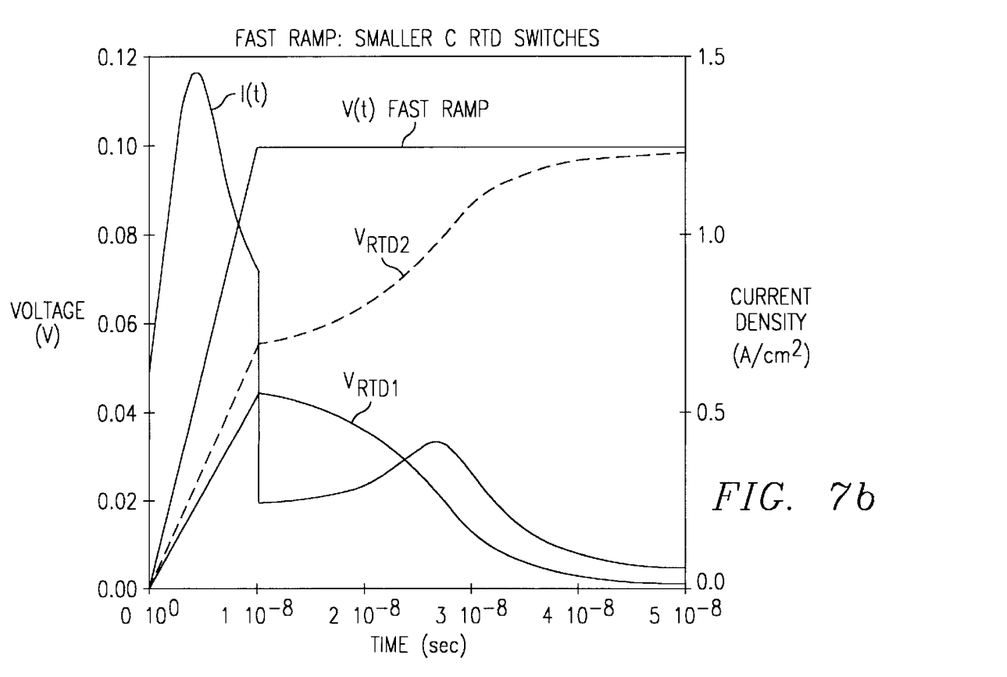

To write a 1 only into the second memory cell which has RTD2 with a higher peak current Ipeak2 than Ipeak1 of RTDI, have capacitor C1 larger than capacitor C2 and increase the ramp rate of V(t) so that the current split through C1 is enough larger than the current through C2 so that as the total current through the cells increases the current through idealized RTD2 reaches Ipeak2 before the current through idealized RTD1 reaches Ipeak1. In this case RTD2 will enter the negative resistance region first and switch to the slate D of high-voltage, low-current first which will push RTD1 back to state A of low-voltage and low-current. Hence, this writes a 1 into the second memory cell while the first memory cell retains a 0. FIGS. 7a–b summarize the writing of a 1 selectively into one of the memory cells in the stack presuming that initially both memory cells contained a 0. In particular, FIG. 7a shows V( ) ramping up 0.1 volt in 100 ns to write a 1 into the memory cell with RTD1 having the Ipeak1 smaller than Ipeak2 and C1 larger than C2. shows a ramp of V(t) up 0.1 volt in 10 ns to write a 1 into the second memory es 7a–b also show the larger total current drawn by the faster ramp due to the large conduction by the capacitors. FIG. 7b also shows the voltage drop across RTD2 is lager than that across RTD1 prior to switching due to C1 splitting off a greater share of the current.

Stack

Figure 8:
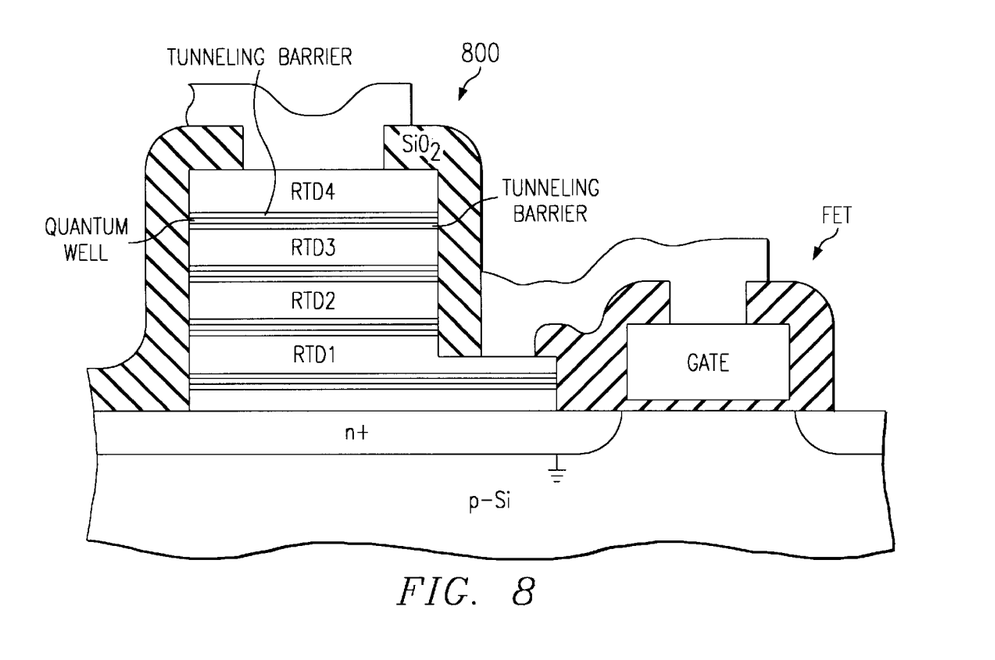
FIG. 8 is a cross sectional elevation view of a stack of four cells.

The two memory cell stack of FIG. 4 can be expanded to more cells in the stack and still provide for selective writing to a single cell. In essence, with a stack of cells having RTDs with increasing peak currents but decreasing capacitances, a succession of increasing stack voltage ramp rates leads to successive RTDs reacing peak current first and thereby switching. In particular, FIG. 8 shows a stack of four cells (RTD1–RTD4) made of silicon RTDs with silicon oxide tunneling barriers. The tunneling barriers are about 1–2 nm thick, the quantum wells between barriers are about 5–10 nm thick, and the stack cross sectional area is about 1 square $\mu$m and may taper to adjust areas of individual RTDs. The cell parameters are as follows:

| Cell No. | Peak current | Capacitance | Voltage ramp rate |
|---|---|---|---|
| 1 | 191 | 398 | 1.89 |
| 2 | 199 | 256 | 3.12 |
| 3 | 208 | 120 | 5.33 |
| 4 | 222 | 48 | 6.60 | where the peak current is in milliamps, the capacitance in pF, and the voltage ramp rate for the stack voltage in terms of $10^5$ volts/second. The increase in peak currents can be simply made by increasing the RTD area; the capacitance decrease can be made simply by decreasing doping in the diode terminals (the silicon adjacent the tunneling barriers). The stack voltage ramp rate to first switch the corresponding RTD provides the cell selection and is set externally. FIG. 8 also shows the common terminal of RTD1 and RTD2 connected to the gate of a FET which can be used for read out as described in following sections.

The stack of FIG. 8 could taper in the opposite direction with the top being smaller than the bottom. In this case the contact between the cells would be near the top. In fact, the physical ordering of the cells in the stack need not correspond to the ramp rate write ordering, so any convenient physical ordering could be used.

Approximations, such as taking the dc current-voltage curve for an RTD to be a straight line up to the peak current (e.g, model as a resistor), make simulating the response of a stack of cells as a function of the peak currents, capacitor sizes, and voltage ramp rates simple, and thus permits design of memory cell stacks with selective writing of 1s: each cell will have a corresponding voltage ramp rate which makes the cell's RTD reach its peak current prior to any other cell's RTD.

Of course, once a 1 has been written to a first memory cell in a stack using the ramp rate of the first cell, then a 1 can be written to a second cell simply by using the ramp rate of the second cell. Indeed, the more 1s written the more robust the writing of further 1s becomes due to the fewer competing peak currents to be avoided.

Preferred embodiment stack read/write

Figure 9:
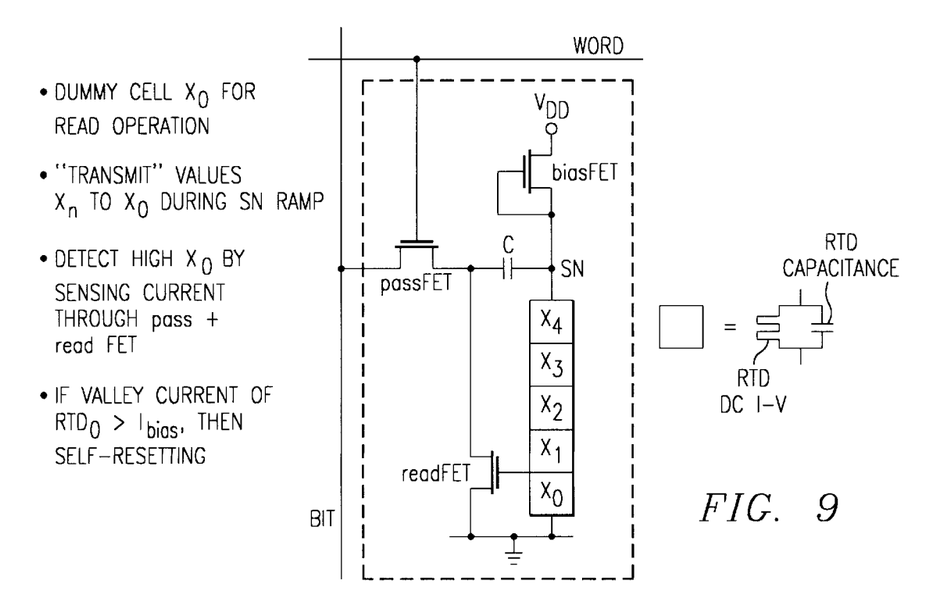
FIG. 9 is a schematic diagram of a first preferred embodiment stack of cells for a memory array.

FIG. 9 schematically illustrates a stack of memory connected in a memory array with wordline and bitline for access to the stack which stores four bits. In particular, the stack has five memory cells (labelled X0, X1, X2, X3, and X4) with the RTD peak currents increasing from cell X0 to X4 and the capacitors decreasing from X0 to X4, so the voltage ramp rate on the stack (node SN) to write a 1 increases from X0 to X4. The stack of cells is connected in series between a current source (depletion mode transistor biasFET connected to a supply voltage Vdd) and ground with an enhancement mode pass transistor (passFET) and capacitor C coupling the node SN to the bit line and an enhancement mode transistor (readFET) for reading cell contents in the stack. The current source provides the Ibias to maintain each cell in one of the two states as previously described. The reading of the contents of data cells X1, X2, X3, and X4 occurs sequentially and uses read cell X0 and proceeds through passFET and readFET, as described below. Again, varying rates of voltage ramping of the stack permits writing a 1 to a selected cell basically as previously described; but the generation of the varying voltage ramps depends upon varying the wordline voltage together with a constant bitline voltage step, as follows.

Capacitor C has at least ten times the capacitance of capacitor of cell X0 (the largest capacitor), so capacitor C.

Figure 10A:
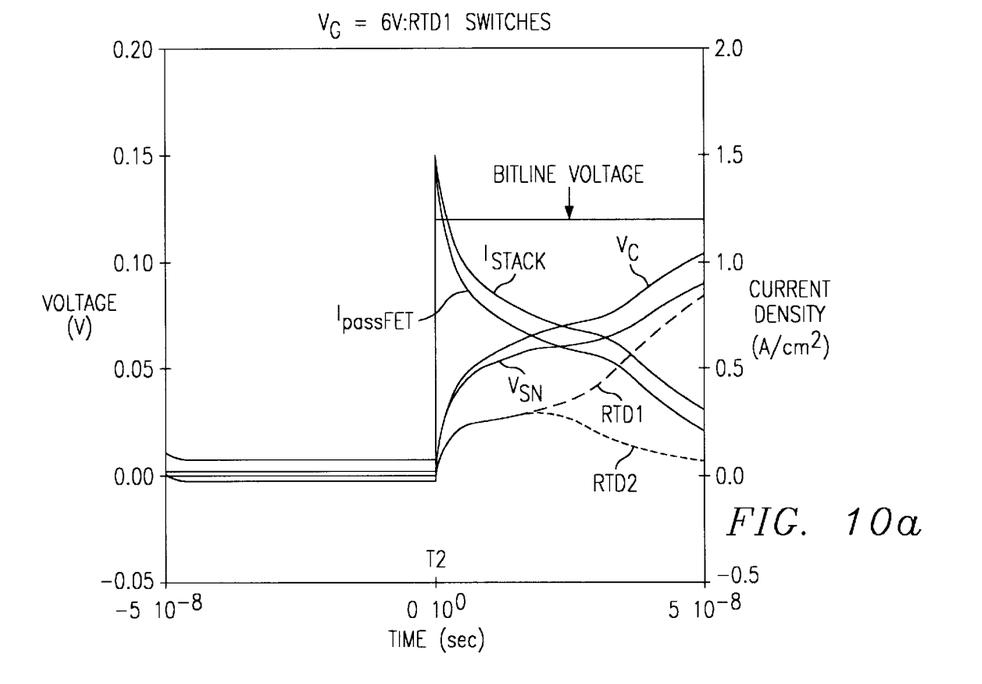
FIGS. 10a–b illustrate memory array writing.
Figure 10B:
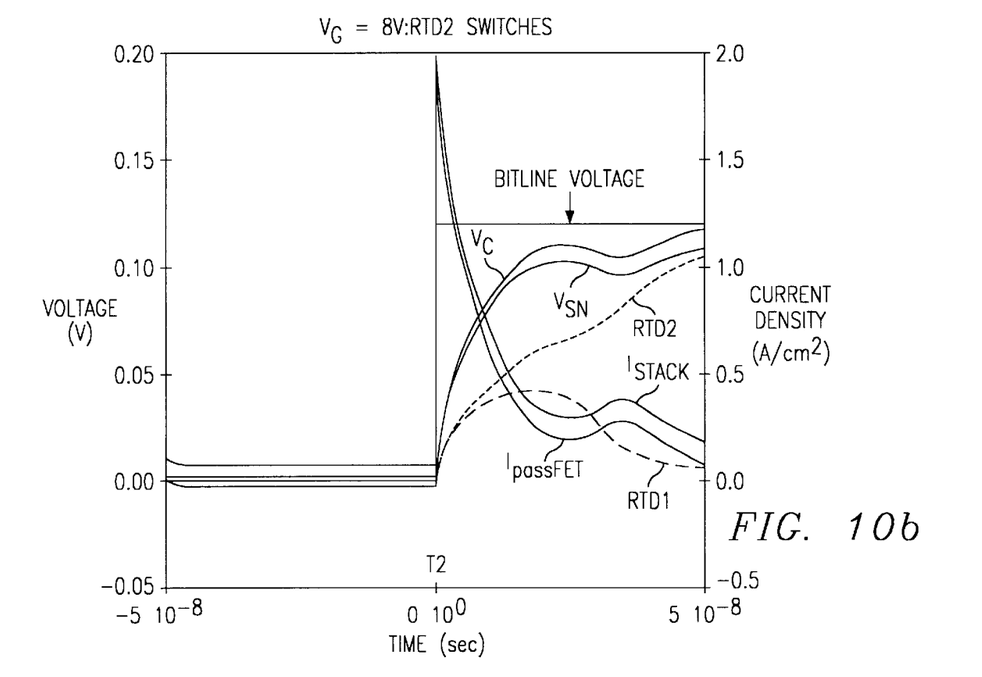

Pass transistor passFET has a turned-on impedance depending upon its gate voltage which is just the voltage on the wordline. Thus with the bitline at ground, if passFET is turned on by a first wordline voltage and then the voltage on the bitline jumped from ground to 0.12 volt, the voltage at node SN at the top of the stack of cells will ramp up at a first rate and then begin levelling off, wheres if the wordline voltage had been a second higher voltage, the passFET impedance would have been less and the voltage ramp at SN would have been greater. This implies that the memory cell stack may have its voltage ramped up by a jump of the bitline voltage when passFET is turned on, and the wordline voltage determines the voltage ramp rate and thus which cell has a 1 written in it. FIGS. 10a–b illustrate this for the simplified case of just two cells in the stack. FIG. 10a shows the wordline at 6 volts when the bitline is jumped from ground to 0.12 volt, and FIG. 10b shows the case of the wordline at 8 volts when the bitline voltage jumps. Note that the voltage at node SN ramps much more quickly in FIG. 10b than in FIG. 10a, and that the increased voltage drop on RTD2 in FIG. 10b indicates the cell with RTD2 had a 1 written in contrast to the increased voltage drop on RTD1 in FIG. 10a and its writing of a 1 to the cell with RTD1. More than two cells in the stack requires more than two wordline levels to generate the more than two ramp rates at node SN from the bitline jump to select among the more than two cells.

The write/read operation of the stack of FIG. 9 proceeds as follows.

Figure 11:
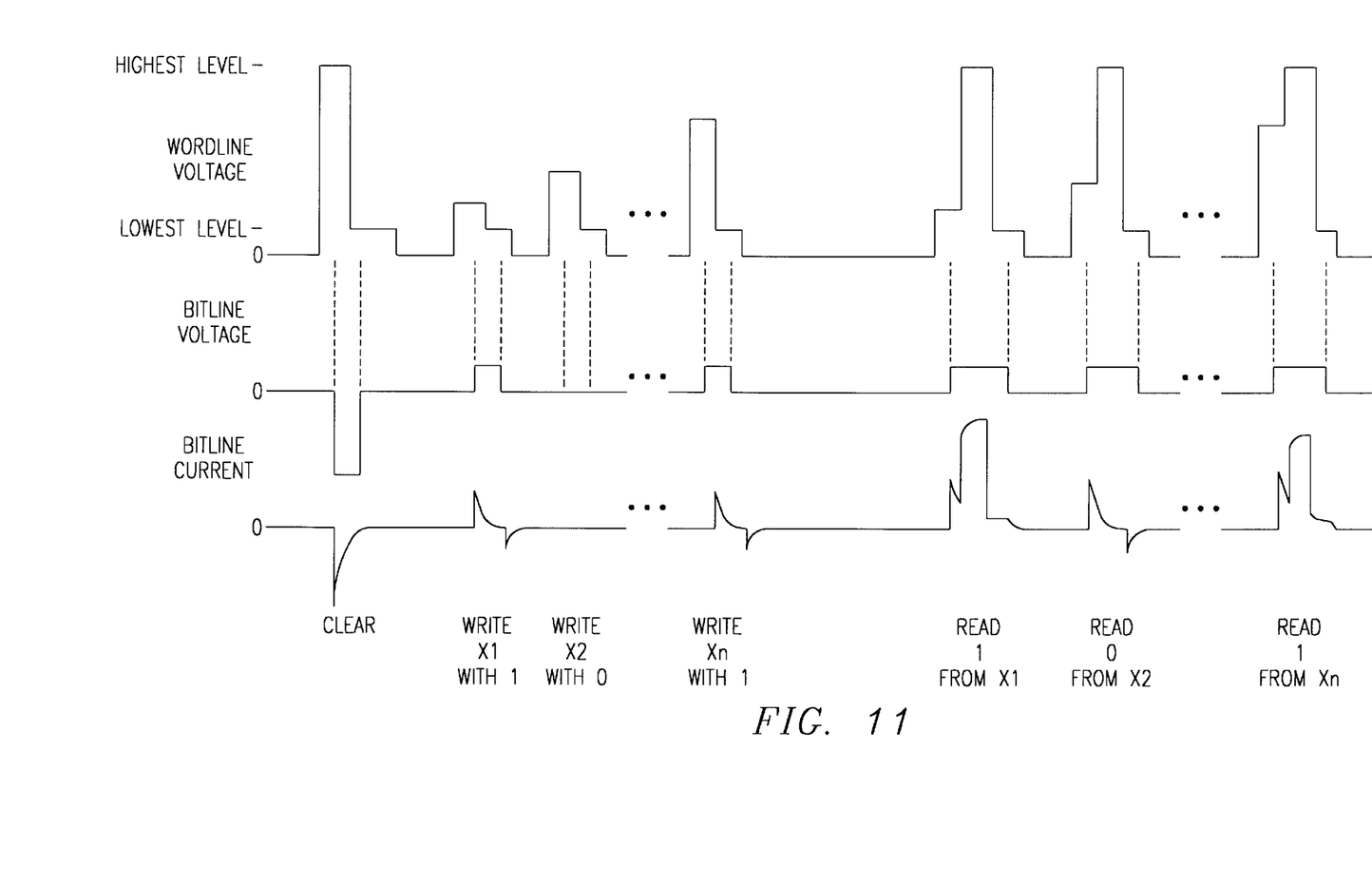
FIG. 11 is a timing diagram for a stack clear, cell writings, and cell readings.

First, clear the cells X0–X4 to 0s (so each cell's RTD is in the state of low-current and low-voltage) by setting the wordline to the highest level (that which would generate a ramp rate at node SN greater than that to write a 1 to cell X4) and then dropping the bitline voltage from ground to a negative 0.3 volt. This forces the voltage at node SN down and discharges any of the capacitors in the cells which had RTDs in the high voltage state. Consequently, all of the RTDs into the low voltage state; that is, the cells contain 0s. Then drop the wordline voltage to the lowest turned-on level (which would be used for writing a 1 to readout cell X0) and bring the bitline back to ground, this brings the bitline side plate of capacitor C to ground. Lastly, drop the wordline voltage to ground to turn off passFET. At this point each of the cells X0–X4 contains a 0, and readFET is turned off because the RTD of cell X0 is in the low-voltage state and this is the gate voltage for readFET. FIG. 11 is a timing diagram for the clear, write, and read operations; and the left-handed portion shows the wordline and bitline voltages together with the bitline current for the clear operation.

Next, write a 1 to a desired one of the four data cells X1–X4 by setting the wordline to the corresponding level, then jumping the bitline voltage from ground to 0.12 volt: this ramps up the stack voltage (at node SN) as described in connection with FIGS. 10a–b to make the desired cell's RTD reach peak current first and switch into the high-voltage, low-current state and thereby store the desired 1. Repeat for each desired 1 to be written. The left center portion of FIG. 11 shows the wordline voltage being stepped through all of its levels (from X1 to X4) and corresponding bitline voltage jumps or lack of jumps to write 1s or retain 0s in the data cells. As wit the clear operation, after the wordline level is used to write a bit, the wordline voltage drops to the X0 level to keep passFET turned on as the bitline voltage returns to ground. FIG. 11 also shows the current spikes on the bitline which essentially charge up the capacitor in the cell being written. The read cell X0 remains in the low-voltage and low-current state, so readFET remains turned off and does not draw current.

Lastly, the righthand portion of FIG. 11 shows the sequential (X1 to X4) read out of bits from the stack. In particular, first set the wordline voltage to or just below the level required to write to cell X1, then jump the bitline voltage to 0.12 volt as in a write to, X1: this will write a 1 to cell X1 if cell X1 contains a 0, but will write a 1 to cell X0 if cell X1 already contained a 1. That is, if cell X1's RTD already is in the high-voltage and low-current state, the increasing current through the stack will make cell X0's RTD reach peak current before any of the other cells' RTDs because the wordline voltage was closer to the voltage to write to cell X0 than to the voltage to write to cells X2–X4 and thus the voltage ramp rate at node SN was closer to the ramp rate for writing cell X0 and thus wrote a 1 to cell X0. Cell X0 containing a 1 (the high-voltage state) turns on readFET because the gate voltage of readFET is just the voltage drop across cell X0.

Next, increase the wordline voltage to its highest level to maximally turn on passFET, this will cause a large current draw on the bitline if readFET is turned on (due to the 1 in cell X0 which reflects the original 1 in cell X1 as illustrated in FIG. 11) or will no effect if readFET is turned off (due to a 0 in cell X0 which reflects the original 0 in cell X1 that was converted to a 1 when the wordline was at or just below the writing level for cell X1). In short, the original bit of X1 is reflected in the current on the bitline when the wordline voltage is maximized: an original bit equal 0 implies minimal bitline current and an original bit equal to 1 implies a large bitline current pulse.

Complete the cell X1 bit read by dropping the wordline voltage to the X0 cell write level and then dropping the bitline to ground; cell X0 has reset itself to the low-voltage state and turned off readFET. In fact, fabricate cell X0's RTD with a higher valley current (such as by varying the quantum well width) than the other cells'RTDs, and set the Ibias from the current source to a level between these valley current levels so that Ibias is lower than the valley current of only cell X0's RTD. This implies that after a write or read of a bit and the current through the stack drops to Ibias, cell X0 will automatically reset itself to contain a 0 bit because it has only one stable state for a current level of Ibias. For such a cell X0, the high-voltage state only persists during the transients with higher current through the stack exceeding Ibias; thus the maximal wordline level used to generate the bitline current while readFET is turned on must occur before cell X0 resets and turns off readFET.

After the read of the bit in cell X1 (which has forced cell X1 to contain a 1), the wordline voltage is set to just below the level to write to cell X2 and the bitline voltage jumped from ground to 0.12 volt. This will write a 1 into cell X2 and leave cell X0 with a 0 if cell X2 initially contained a 0; and (in analogy with the read of cell X1) will write a 1 to cell X0 if cell X2 already contains a 1 because the ramp rate will be closer to writing to cell X0 than to either of cells X3–X4. That is, with cells X1 and X2 already containing 1s, the increasing current through the stack will reach peak current for cell X0 prior to reaching peak current for either of cells X3–X4 and cell X0 switches. Indeed, the wordline voltage just needs to be high enough to write to cell X2 prior to writing to cell X0 and low enough to write to cell X0 prior to writing to either of cells X3 and X4.

Again, once the writing to one of cells X2 and X0 occurs, set the wordline voltage to maximum and sense the bitline current: if cell X2 had originally contained a 0, then cell X0 will contain a 0 and readFET will be off and no bitline current. Contrarily, if cell X2 had contained a 1, then cell X0 will (transiently) contain a 1 and readFET will be turned on the a large bitline current pulse will occur. After the read, reset cell X0 to contain a 0.

Repeat this read procedure for cell X3 and then again for cell X4. At this point all of the data cells X1=X4 will contain 1s and must be rewritten with the read bits if the read is to be nondestructive.

Fabrication

The preferred embodiments stacks of cells may be fabricated by growth of layers on a wafer (i.e., alternating silicon and silicon oxide on a silicon wafer or alternating wide and narrow bandgap III-V compounds on a GaAs wafer) in a molecular beam epitaxy machine followed by photolithographical definition of mesa tops (about 1 μm square). Then anisotropic etching such as a plasma etch using fluorine and bromine compounds in a high density plasma with some profile control (isotropy) by plasma potential control will form mesas. Further, wet etches which etch highly doped silicon more rapidly than lightly doped could provide some undercut in a stack as illustrated in FIG. 8 because the bottom RTD in FIG. 8 has the larger capacitance and thus higher silicon doping. Each mesa constitutes a stack of cells. The transistors are formed adjacent the mesas and on the wafer surface. Liftoff metal to form wordlines, bitlines and connections between the stack, the transistors, and lines.

More generally, the physical ordering of the RTDs in a stack as in FIG. 8 need not correspond to the ramp rate access ordering, so any convenient physical ordering may by used. That is, if a middle RTD in a stack has the highest peak current and smallest capacitance, then with the fastest amp this middle RTD is written to. The only constraint is that the readFET be controlled by the voltage across the slowest ramp rate cell which implies contacts to both sides of the sloest cell and the drop fed to the readFET.

Modifications and advantages

The preferred embodiments may be varied in many ways while retaining one or more of the features of a stack of RTDs with varying characteristics for selective writing and reading the state of each RTD. For example, the particular voltages, capacitances, stack voltage ramp rates, dimensions, and physical layouts of the cekks could be varied provided the relation between these parameters permits the selective writing of bits to the data cells and the sequential read out by successively increasing stack voltage ramp rates. Indeed, a direct amplifier input connected to the read out cell could be used in place of the wordlin pulse plus bitline current sensing. The ramp rates could be inverted in the sense that the read out cell could have the highest stack voltage ramp rate, and the sequential read out proceeds with successively slower ramp rates. Further, the read out cell X0 could have a ramp rate which is neither the largest nor the smallest, and the read out would constitute two sequences: first start with a ramp rate slightly below the next higher than X0's ramp rates and increase ramp rates (wordline voltages) to detect bits in higher ramp cells than X0; then go to a ramp rate slightly above the next lower than X0's ramp rate and decrease ramp rates to detect bits in lower ramp rate cells.

What is claimed is:

1. A resonant tunneling diode stack, comprising:

(a) series connected resonant tunneling diodes, RTD0, RTD1, . . . RTDn, between a node and a reference voltage;

(b) a current source connected to said node; and (c) wherein RTD0 has a valley current less than a current supplied by said current source and RTD1, . . . RTDn each has a valley current larger than said current supplied by said current source.

2. The stack of claim 1, further comprising:

(a) an output transistor coupled to said RTD0.

3. The stack of claim 1, wherein:

(a) each of said RTD0, . . . RTDn has a stack voltage ramp rate; and (b) no two of said ramp rates are equal.

* * * * *